US011501958B2

(12) United States Patent
Okunishi et al.

(10) Patent No.: US 11,501,958 B2
(45) Date of Patent: Nov. 15, 2022

(54) PLASMA PROCESSING APPARATUS

(71) Applicant: TOKYO ELECTRON LIMITED, Tokyo (JP)

(72) Inventors: Naohiko Okunishi, Miyagi (JP); Nozomu Nagashima, Miyagi (JP); Tomoyuki Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 79 days.

(21) Appl. No.: 16/037,461

(22) Filed: Jul. 17, 2018

(65) Prior Publication Data

US 2019/0027344 A1     Jan. 24, 2019

(30) Foreign Application Priority Data

Jul. 19, 2017 (JP) .............................. JP2017-139920

(51) Int. Cl.
*H01J 37/32* (2006.01)
*H01L 21/683* (2006.01)
(Continued)

(52) U.S. Cl.
CPC .... *H01J 37/32577* (2013.01); *C23C 16/4586* (2013.01); *H01J 37/32174* (2013.01);
(Continued)

(58) Field of Classification Search
CPC .......... H01J 37/32577; H01J 37/32183; H01J 37/32724; H01J 37/32715;
(Continued)

(56) References Cited

U.S. PATENT DOCUMENTS 5,531,834 A * 7/1996 Ishizuka ............... C23C 16/509
   118/723 I
6,538,890 B2 * 3/2003 Kodaka ................ H05K 1/0203
   257/706

(Continued)

FOREIGN PATENT DOCUMENTS

CN     101661871 A     3/2010
CN     106233435 A    12/2016
(Continued)

OTHER PUBLICATIONS

"Coaxial" definition by Merriam-Webster online dictionary (Accessed Aug. 2020).*

*Primary Examiner* — Gordon Baldwin
*Assistant Examiner* — Kurt Sweely
(74) *Attorney, Agent, or Firm* — Weihrouch IP

(57) ABSTRACT

A plasma processing apparatus includes a stage for supporting a target object in a chamber defined by a chamber body. The stage includes a lower electrode, an electrostatic chuck provided on the lower electrode, heaters provided in the electrostatic chuck, and terminals electrically connected to the heaters. A conductor pipe electrically connects a high frequency power supply and the lower electrode and extends from the lower electrode to the outside of the chamber body. Power supply lines supply power from a heater controller to the heaters. Filters partially forming the power supply lines prevent the inflow of high frequency power from the heaters to the heater controller. The power supply lines include wirings which respectively connect the terminals and the filters and extend to the outside of the chamber body through an inner bore of the conductor pipe.

20 Claims, 7 Drawing Sheets

(51) Int. Cl.
*H01L 21/687* (2006.01)
*C23C 16/458* (2006.01)

(52) U.S. Cl.
CPC .. *H01J 37/32715* (2013.01); *H01J 37/32724* (2013.01); *H01L 21/6833* (2013.01); *H01L 21/68785* (2013.01); *H01L 21/68792* (2013.01); *H01J 37/32091* (2013.01); *H01J 37/32165* (2013.01); *H01J 37/32183* (2013.01); *H01J 37/32706* (2013.01)

(58) Field of Classification Search
CPC ........... H01J 37/32091; H01J 37/32082; H01J 37/32174; H01J 37/321; H01J 37/32266; H01J 37/32522; H01J 37/32165; H01J 37/32706; H01L 21/67248; H01L 21/6833; H01L 21/6831; H01L 21/67069; H01L 21/68785; H01L 21/68792; C23C 14/541; C23C 16/4583; C23C 16/4586; C23C 14/50; C23C 16/46; C23C 16/505
See application file for complete search history.

(56) References Cited

U.S. PATENT DOCUMENTS

| | | | | |
|---|---|---|---|---|
| 6,878,211 | B2* | 4/2005 | Yamaguchi | C23C 16/4583 118/500 |
| 7,718,930 | B2* | 5/2010 | Kawasaki | C23C 16/4581 219/444.1 |
| 8,206,552 | B2* | 6/2012 | Chen | H01J 37/32706 156/345.44 |
| 8,398,815 | B2* | 3/2013 | Yamazawa | H01J 37/32174 156/345.44 |
| 8,898,889 | B2* | 12/2014 | Nam | H01J 37/32577 204/298.02 |
| 2005/0274324 | A1* | 12/2005 | Takahashi | H01L 21/6831 118/723 E |
| 2009/0242135 | A1* | 10/2009 | Koshimizu | H01J 37/32091 156/345.48 |
| 2014/0034612 | A1* | 2/2014 | Yang | H01L 21/67109 216/71 |
| 2014/0110061 | A1 | 4/2014 | Okunishi | |
| 2014/0302256 | A1* | 10/2014 | Chen | C23C 16/5096 427/569 |
| 2015/0262793 | A1* | 9/2015 | Okunishi | H01J 37/32256 156/345.24 |

FOREIGN PATENT DOCUMENTS

| | | |
|---|---|---|
| JP | 2011-529273 A | 12/2011 |
| JP | 2014-99585 A | 5/2014 |
| JP | 2016-219790 A | 12/2016 |
| KR | 10-2005-0106506 A | 11/2005 |
| KR | 10-1465849 B1 | 11/2014 |
| KR | 10-1481377 B1 | 1/2015 |
| WO | 2010/011521 A2 | 1/2010 |

* cited by examiner

PLASMA PROCESSING APPARATUS

CROSS-REFERENCE TO RELATED APPLICATIONS

This application claims priority to Japanese Patent Application No. 2017-139920 filed on Jul. 19, 2017, the entire contents of which are incorporated herein by reference.

FIELD OF THE INVENTION

The present disclosure relates to a plasma processing apparatus.

BACKGROUND OF THE INVENTION

A plasma processing apparatus is used in manufacturing electronic devices such as semiconductor devices. The plasma processing apparatus includes a chamber body, a stage, and a high frequency power supply. The chamber body provides an inner space thereof as a chamber. The stage is provided in the chamber and configured to hold a target object mounted thereon. The stage includes a lower electrode and an electrostatic chuck. A high frequency power supply is connected to the lower electrode.

In the plasma processing performed by the plasma processing apparatus, it is required to control temperature distribution in the surface of the target object. In order to control the temperature distribution in the surface of the target object, a plurality of heaters is provided at the stage. The heaters are connected to a heater controller through a plurality of power supply lines, respectively.

A high frequency power is supplied from the high frequency power supply to the lower electrode of the stage. The high frequency power supplied to the lower electrode can flow into a plurality of power supply lines. Therefore, a plurality of filters for blocking or attenuating the high frequency is provided on the plurality of power supply lines, respectively. As described in Japanese Patent Application Publication No. 2014-99585, the filters are provided outside the chamber body. Accordingly, the plurality of power supply lines includes a plurality of wirings extending from the electrostatic chuck to the outside of the chamber body.

Each of the wirings extending from the electrostatic chuck to the outside of the chamber body generates a stray capacitance with respect to the ground potential. As a result, the impedance of the filters on the plurality of power supply lines with respect to the high frequency is decreased. The decrease in the impedance of the filters on the power supply lines results in high frequency loss. Due to the high frequency loss, the plasma processing is affected. For example, the etching rate is decreased due to the high frequency loss. Therefore, it is required to decrease the stray capacitance of each of the wirings extending from the electrostatic chuck that includes a plurality of heaters to the outside of the chamber body.

SUMMARY OF THE INVENTION

In accordance with an aspect, there is provided a plasma processing apparatus including a chamber body, a stage, a high frequency power supply, a conductor pipe, a plurality of power supply lines and a plurality of filters. The chamber body defines a chamber therein. The stage is configured to support a target object in the chamber. The stage includes a lower electrode, an electrostatic chuck provided on the lower electrode, a plurality of heaters provided in the electrostatic chuck and a plurality of terminals electrically connected to the plurality of heaters. The high frequency power supply is provided outside the chamber body and configured to generate a high frequency power to be supplied to the lower electrode. The conductor pipe is configured to electrically connect the high frequency power supply and the lower electrode. The conductor pipe extends from the lower electrode to the outside of the chamber body. The plurality of power supply lines is configured to supply power from a heater controller to the plurality of heaters. Each of the plurality of filters partially forms each of the plurality of power supply lines. The filters are provided outside the chamber body and configured to prevent the inflow of high frequency power from the heaters to the heater controller. The plurality of power supply lines includes a plurality of wirings respectively connecting the plurality of terminals and the plurality of filters. The plurality of wirings extends to the outside of the chamber body through an inner bore of the conductor pipe.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
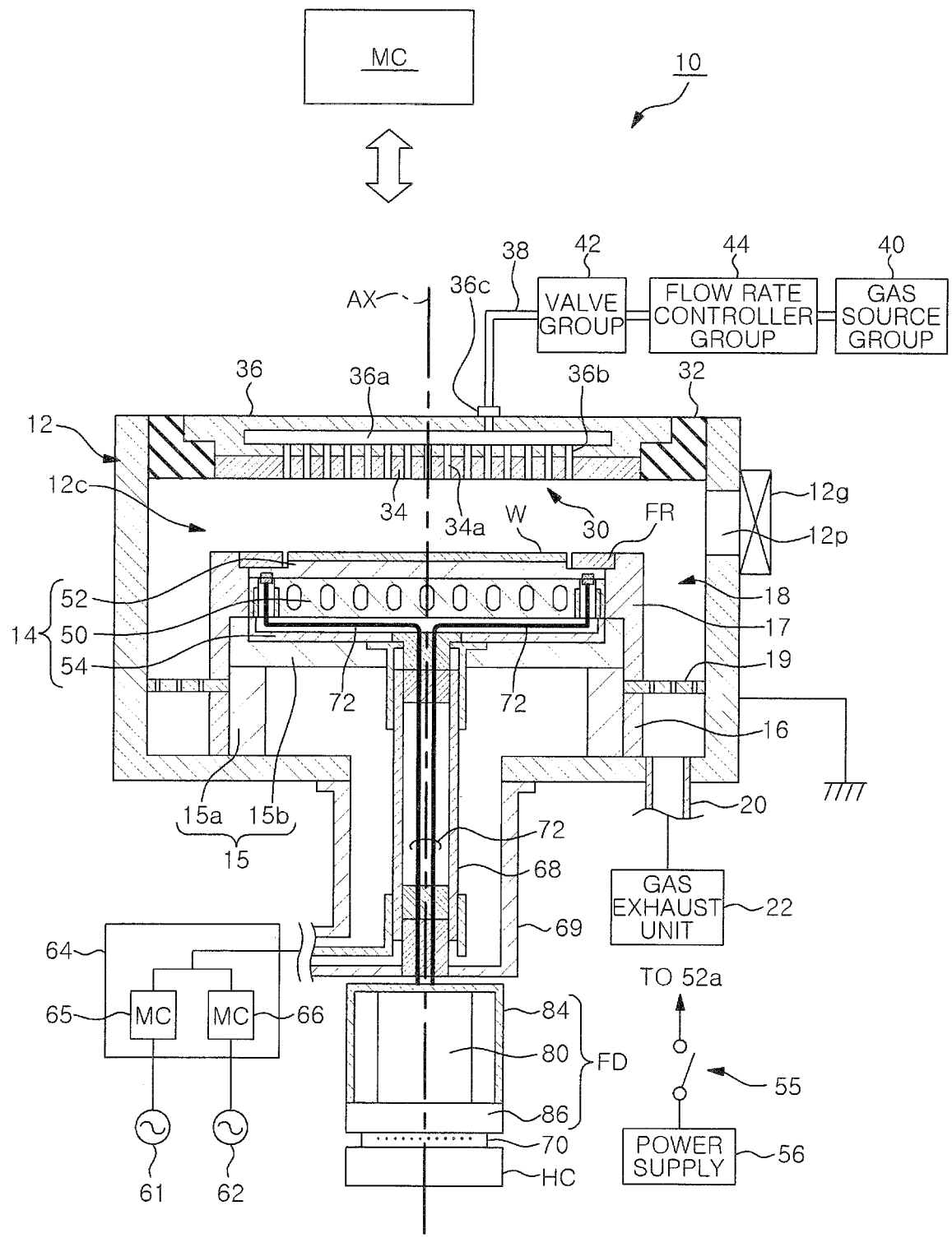
FIG. 1 schematically shows a plasma processing apparatus according to an embodiment.

Hereinafter, various embodiments will be described in detail with reference to the accompanying drawings. Like reference numerals will be given to like or corresponding parts throughout the drawings.

FIG. 1 schematically shows a plasma processing apparatus according to an embodiment. FIG. 1 shows the plasma processing apparatus with a part thereof cut out. The plasma processing apparatus 10 shown in FIG. 1 is a capacitively coupled plasma processing apparatus.

The plasma processing apparatus 10 includes a chamber body 12. The chamber body 12 has a substantially cylindrical shape, and provides an inner space thereof as a chamber 12c. The chamber body 12 is made of, e.g., aluminum or stainless steel. The chamber body 12 is grounded. A plasma resistant film is formed on an inner wall surface of the chamber body 12, i.e., a wall surface defining the chamber 12c. This film may be a film formed by anodic oxidation treatment or a ceramic film made of yttrium oxide. An opening 12p is provided at a sidewall of the chamber body 12. The target object W passes through the opening 12p when the target object W is loaded into or unloaded from the chamber 12c. A gate valve 12g for opening/closing the opening 12p is attached to the sidewall of the chamber body 12. The target object W may be a disc-shaped plate made of, e.g., silicon.

A stage 14 is provided in the chamber 12c. A target object W is mounted on the stage 14. The stage 14 is configured to support the target object W in the chamber 12c. The stage 14 is supported by a supporting part 15. In one embodiment, the supporting part 15 has a first member 15a and a second member 15b. The first member 15a is made of an insulator such as ceramic, has a substantially cylindrical shape, and extends upward from a bottom portion of the chamber body 12. The second member 15b is provided on an upper end of the first member 15a. The second member 15b is made of an insulator such as ceramic and has a substantially annular plate shape. In other words, the second member 15b has a substantially disc shape with an open center portion. The stage 14 is provided on the second member 15b. The stage 14 and the supporting part 15 are coupled to ensure airtightness of the space in the chamber body 12.

A tubular member 16 extends upward from the bottom portion of the chamber body 12. The tubular member 16 is made of a conductor and has a substantially cylindrical shape. The tubular member 16 extends along an outer periphery of the first member 15a of the supporting part 15, and the potential of the tubular member 16 is set to the ground potential. An insulating member 17 is provided above the tubular member 16. The insulating member 17 is made of an insulator such as quartz, and has a substantially cylindrical shape. The insulating member 17 extends along an outer periphery of the stage 14 and an outer periphery of the second member 15b of the supporting part 15. A gas exhaust path 18 is formed between the tubular member 16 and the sidewall of the chamber body 12 and between the insulating member 17 and the sidewall of the chamber body 12.

A baffle plate 19 is provided in the gas exhaust path 18. The baffle plate 19 has a substantially annular plate shape. The baffle plate 19 may be formed, for example, by coating an aluminum base material with ceramic such as yttrium oxide or the like. A plurality of through-holes is formed in the baffle plate 19, and an inner peripheral portion of the baffle plate 19 is held between the tubular member 16 and the insulating member 17. An outer peripheral portion of the baffle plate 19 is coupled to the sidewall of the chamber body 12. Below the baffle plate 19, a gas exhaust line 20 is connected to the bottom portion of the chamber body 12, with a gas exhaust unit 22 connected to the gas exhaust line 20. The gas exhaust unit 22 includes a pressure controller such as an automatic pressure control valve, and a vacuum pump such as a turbo molecular pump or the like, and thus can decrease the pressure in the chamber 12c.

The plasma processing apparatus 10 further includes an upper electrode 30. The upper electrode 30 is provided above the stage 14. The upper electrode 30 blocks an upper opening of the chamber body 12 in cooperation with a member 32. The member 32 has an insulating property. The upper electrode 30 is held on an upper portion of the chamber body 12 through the member 32. A potential of the upper electrode 30 is set to the ground potential when a first high frequency power supply to be described later is electrically connected to the lower electrode of the stage 14.

The upper electrode 30 includes a ceiling plate 34 and a holder 36. A bottom surface of the ceiling plate 34 defines a chamber 12c. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base material. This film may be a film formed by anodic oxidation treatment or a ceramic film made of yttrium oxide.

The holder 36 detachably holds the ceiling plate 34. The holder 36 may be made of a conductive material, e.g., aluminum. A gas diffusion space 36a is provided inside the holder 36. A plurality of gas holes 36b extends downward from the gas diffusion space 36a. The gas holes 36b communicate with the gas injection holes 34a. A gas inlet port 36c for introducing a gas into the gas diffusion space 36a is formed in the holder 36, and a gas supply line 38 is connected to the gas inlet port 36c.

A gas source group 40 is connected to the gas supply line 38 through a valve group 42 and a flow rate controller group 44. The gas source group 40 includes a plurality of gas sources, the valve group 42 includes a plurality of valves, and the flow rate controller group 44 includes a plurality of flow rate controllers. Each of the flow rate controllers of the flow rate controller group 44 is a mass flow controller or a pressure control type flow rate controller. The gas sources of the gas source group 40 are connected to the gas supply line 38 through the corresponding valves of the valve group 42 and the corresponding flow rate controllers of the flow rate control group 44. The plasma processing apparatus 10 can supply gases from one or more gas sources selected among the plurality of gas sources of the gas source group 40 into the chamber 12c at individually controlled flow rates.

The plasma processing apparatus 10 further includes a control unit MC. The control unit MC is a computer including a processor, a storage device, an input device, a display device and the like, and controls the respective components of the plasma processing apparatus 10. Specifically, the control unit MC executes a control program stored in the storage device, and controls the respective components of the plasma processing apparatus 10 based on a recipe data stored in the storage device. Thus, in the plasma processing apparatus 10, a process specified by the recipe data is performed under the control of the control unit MC.

Figure 2:
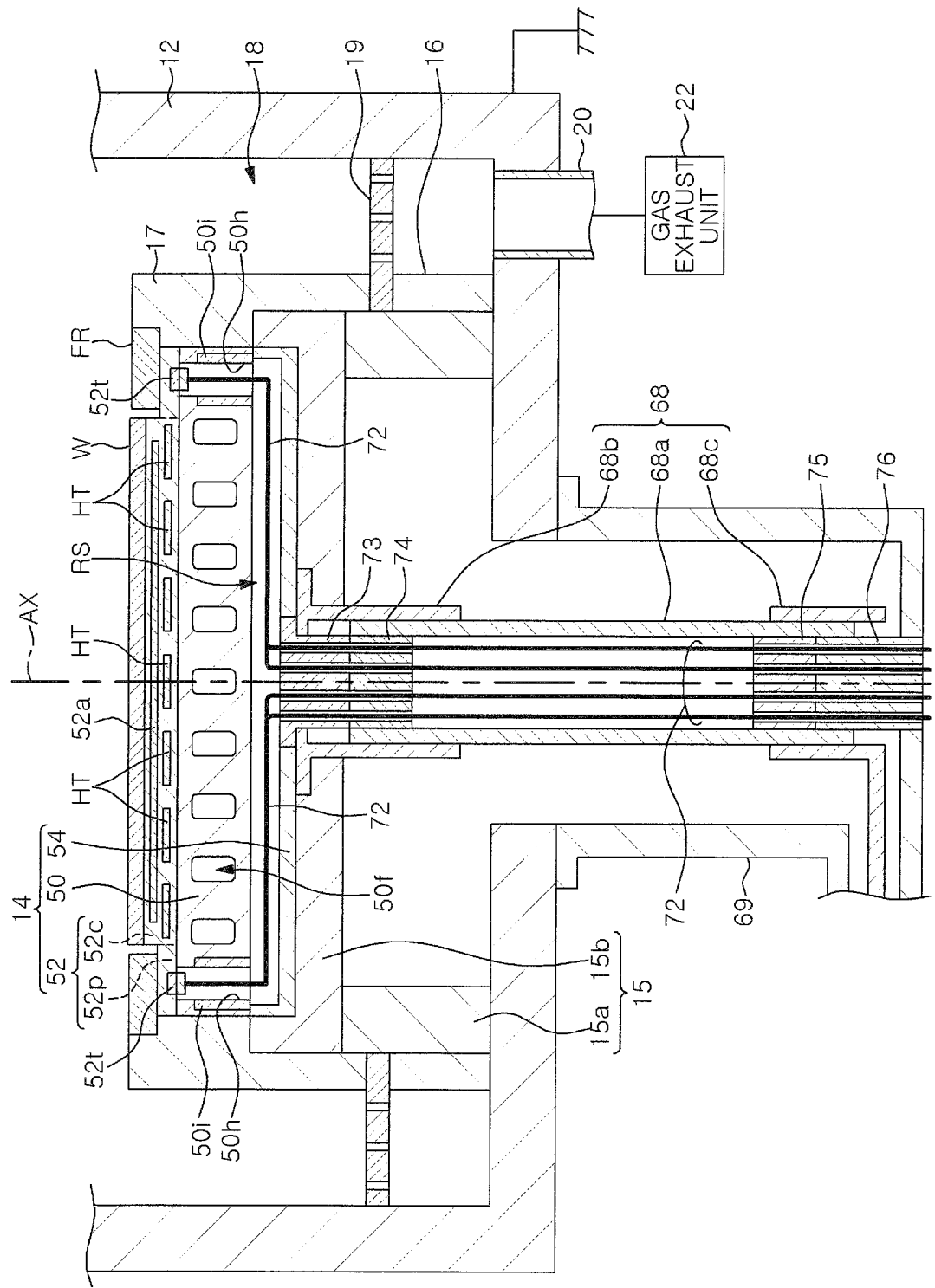
FIG. 2 is an enlarged cross sectional view showing a stage of the plasma processing apparatus shown in FIG. 1.

Hereinafter, the stage 14 and the components of the plasma processing apparatus 10 that are related to the stage 14 will be described in detail. Hereinafter, FIGS. 1 and 2 will be referred to. FIG. 2 is an enlarged cross sectional view of the stage of the plasma processing apparatus shown in FIG. 1. As shown in FIGS. 1 and 2, the stage 14 includes a lower electrode 50 and an electrostatic chuck 52. In one embodiment, the stage 14 further includes a conductive member 54.

The lower electrode 50 has a substantially disc shape and is made of a conductor such as aluminum. A flow path 50f is formed in the lower electrode 50. A coolant is supplied into the flow path 50f from a chiller unit (not shown) provided outside the chamber body 12. The coolant supplied into the flow path 50f is returned to the chiller unit.

The conductive member 54 is provided below the lower electrode 50. The conductive member 54 is made of, e.g., aluminum. The conductive member 54 is electrically connected to the lower electrode 50. A region RS surrounded by the lower electrode 50 and the conductive member 54 is provided below the lower electrode 50. In one embodiment, the conductive member 54 has a substantially annular plate shape. In one embodiment, the conductive member 54, the lower electrode 50, and the electrostatic chuck 52 share a common central axis (hereinafter, referred to as "axis AX"). The axis AX is also the central axis of the chamber body 12 and the chamber 12c in one embodiment. A peripheral portion of the conductive member 54 protrudes more upward than the other portion of the conductive member 54. The peripheral portion of the conductive member 54 is coupled to a peripheral region of a bottom surface of the lower electrode 50.

As shown in FIG. 1, in one embodiment, the plasma processing apparatus 10 further includes a first high frequency power supply 61 and a second high frequency power supply 62. The first high frequency power supply 61 and the second high frequency power supply 62 are provided outside the chamber body 12. The first high frequency power supply 61 mainly generates a first high frequency power that contributes to plasma generation. The frequency of the first high frequency power is, e.g., 100 MHz. The first high frequency power supply 61 is electrically connected to the lower electrode 50 via a matching circuit 65 of a matching unit 64 for impedance matching. The matching circuit 65 has a circuit configured to match the output impedance of the first high frequency power supply 61 and the impedance on a load side. The first high frequency power supply 61 may be connected to the upper electrode 30 via the matching circuit 65.

The second high frequency power supply 62 mainly outputs a second high frequency power that contributes to the attraction of ions into the target object W. The frequency of the second high frequency power is lower than the frequency of the first high frequency power, and may be, e.g., 13 MHz. The second high frequency power supply 62 is electrically connected to the lower electrode 50 via a matching circuit 66 of the matching unit 64. The matching circuit 66 has a circuit configured to match the output impedance of the second high frequency power supply 62 and the impedance of the load side.

The plasma processing apparatus 10 further includes a conductor pipe 68. The conductor pipe 68 is made of a conductor such as aluminum, and has a substantially cylindrical shape. The conductor pipe 68 allows the first high frequency power supply 61 and the second high frequency power supply 62 to be electrically connected to the lower electrode 50. The conductor pipe 68 extends from the lower electrode 50 to the outside of the chamber body 12.

In one embodiment, the conductor pipe 68 shares the axis AX as its central axis. One end (upper end) of the conductor pipe 68 is connected to the conductive member 54. The other end (lower end) of the conductor pipe 68 is connected to the first high frequency power supply 61 and the second high frequency power supply 62 via the matching unit 64. In one embodiment, the matching unit 64 is provided at a side of the conductor pipe 68.

As shown in FIG. 2, in one embodiment, the conductor pipe 68 has a first pipe 68a, a second pipe 68b, and a third pipe 68c. The first pipe 68a is made of a conductor such as aluminum, and has a substantially cylindrical shape. The second pipe 68b is made of a conductor such as aluminum, and has a substantially cylindrical shape. An upper end portion of the first pipe 68a is fitted into an inner bore of the second pipe 68b. The second pipe 68b is connected to the conductive member 54. The third pipe 68c is made of a conductor such as aluminum, and has a substantially cylindrical shape. A lower end portion of the first pipe 68a is fitted into an inner bore of the third pipe 68c. The third pipe 68c is electrically connected to the first high frequency power supply 61 and the second high frequency power supply 62 via the matching unit 64.

A tubular member 69 is provided below the bottom of the chamber body 12 to surround the conductor pipe 68. The tubular member 69 is made of a conductor such as aluminum, and has a substantially cylindrical shape. An upper end of the tubular member 69 is coupled to the bottom of the chamber body 12. The potential of the tubular member 69 is set to the ground potential.

The electrostatic chuck 52 is provided on the lower electrode 50. The electrostatic chuck 52 is configured to hold the target object W mounted thereon. The electrostatic chuck 52 has a substantially disc shape and has a layer made of an insulator such as ceramic. The electrostatic chuck 52 further has an electrode 52a as an inner layer in the insulator layer. A power supply 56 is connected to the electrode 52a via a switch 55 (see FIG. 1). When a voltage, e.g., a DC voltage, from the power supply 56 is applied to the electrode 52a, the electrostatic chuck 52 generates an electrostatic attractive force. Due to the electrostatic attractive force, the target object W is held on the electrostatic chuck 52.

As shown in FIG. 2, the electrostatic chuck 52 includes a central portion 52c and a peripheral portion 52p. The central portion 52c intersects with the axis AX. The target object W is mounted on an upper surface of the central portion 52c. The peripheral portion 52p extends in a circumferential direction at the outer side of the central portion 52c. In one embodiment, the thickness of the peripheral portion 52p is thinner than that of the central portion 52c, and the upper surface of the peripheral portion 52p extends at a position lower than the upper surface of the central portion 52c. A focus ring FR is disposed on the peripheral portion 52p to surround the edge of the target object W.

A plurality of heaters HT is provided in the electrostatic chuck 52. Each of the heaters HT may be a resistance heating element. In one example, the electrostatic chuck 52 has a plurality of regions concentric with the axis AX, and one or more heaters HT are provided in each of the regions. The temperature of the target object W mounted on the stage 14 is controlled by the plurality of heaters HT and/or the coolant supplied to the flow path 50f. In the stage 14, a gas line for supplying a heat transfer gas such as He gas to a gap between the target object W and the electrostatic chuck 52 may be provided.

In one embodiment, the peripheral portion 52p is provided with a plurality of terminals 52t. Each of the terminals 52t is electrically connected to a corresponding heater among the plurality of heaters HT. Each of the terminals 52t and the corresponding heater are connected through an internal wiring in the electrostatic chuck 52.

The power for driving the plurality of heaters HT is supplied from a heater controller HC (see FIG. 1). The heater controller HC includes a heater power supply and is configured to individually supply power (AC output) to the plurality of heaters HT. In order to supply the power from the heater controller HC to the plurality of heaters HT, the plasma processing apparatus 10 includes a plurality of power supply lines 70. The power supply lines 70 supply the power from the heater controller HC to the respective heaters HT. The plasma processing apparatus 10 further includes a filter device FD. The filter device FD is configured to prevent the high frequency from flowing into the heater controller HC through the power supply lines 70. The filter device FD has a plurality of filters.

Figure 3:
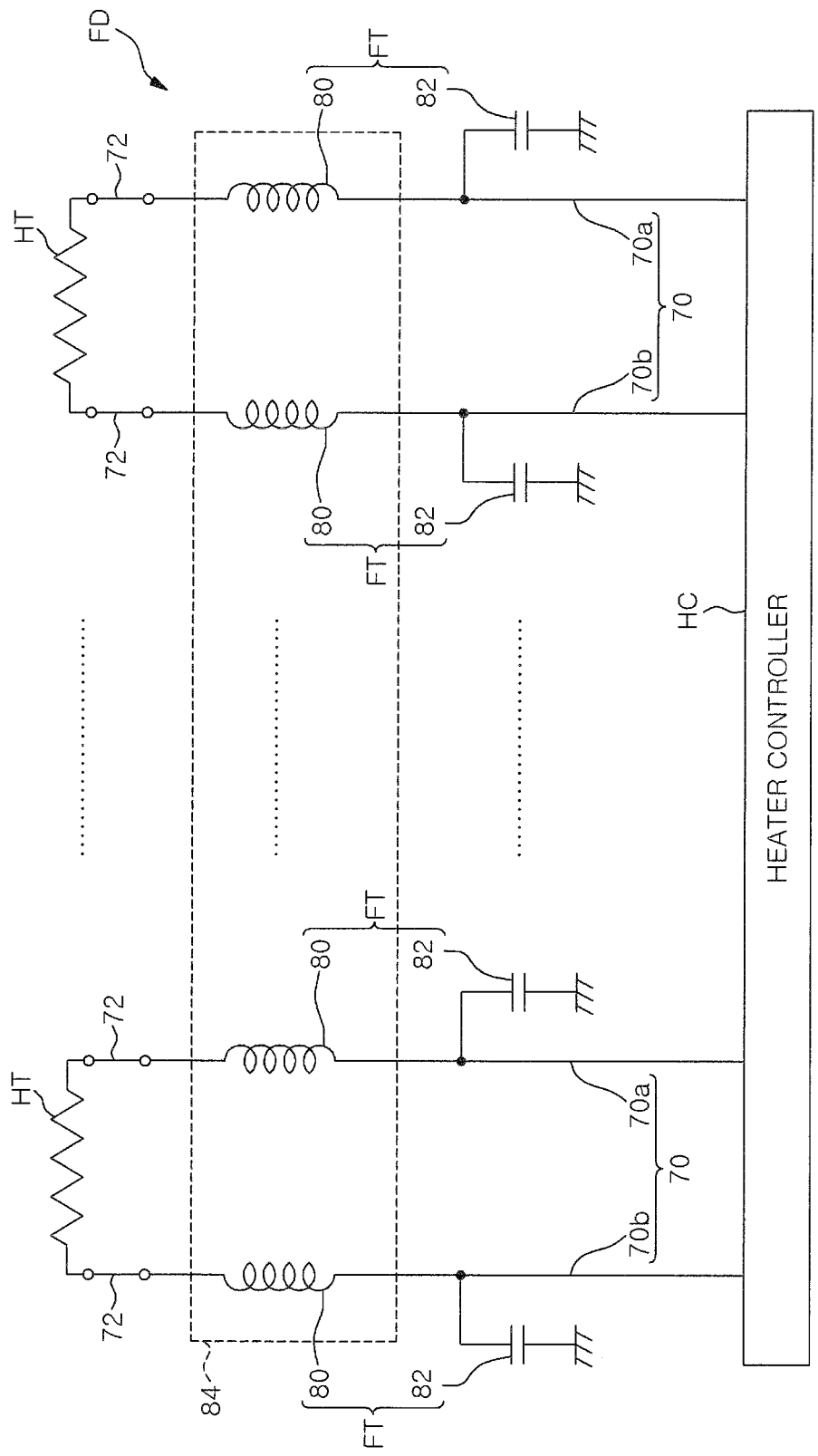
FIG. 3 shows a circuit configuration of a plurality of filters of the plasma processing apparatus shown in FIG. 1 together with a plurality of heaters and a heater controller.

FIG. 3 shows a circuit configuration of the filters of the plasma processing apparatus shown in FIG. 1 together with the heaters and the heater controller. Hereinafter, FIGS. 1 to 3 will be referred to. The heaters HT are connected to the heater controller HC through the respective power supply lines 70 as described above. The power supply lines 70 include a plurality of power supply line pairs, and as shown in FIG. 3, each of the power supply line pairs includes a power supply line 70a and a power supply line 70b. Each of the heaters HT and the heater controller HC are electrically connected through a pair of power supply lines, i.e., the power supply line 70a and the power supply line 70b.

The filter device FD is provided outside the chamber body 12. The filter device FD has a plurality of filters FT. The filter device FD further has a plurality of coils 80 and a plurality of capacitors 82. One of the coils 80 and one of the capacitors 82 corresponding thereto constitute a single filter FT. Each of the coils 80 constitutes a part of each of the power supply lines 70. In other words, each of the filters FT partially constitutes each of the power supply lines.

The plurality of coils 80 is accommodated in a frame 84. As shown in FIG. 1, the frame 84 is a cylindrical container and made of a conductive material. The frame 84 is electrically grounded. The plurality of capacitors 82 is accommodated in a capacitor box 86. The capacitor box 86 is electrically connected to the frame 84. The frame 84 and the capacitor box 86 may be formed as one unit. Each of the capacitors 82 is connected between the capacitor box 86 and one end of the corresponding coil 80 that is opposite the other end of the corresponding coil 80 facing the heater HT. The coil 80 of each filter FT and the frame 84 constitute a distributed constant line. In other words, each of the filters FT has impedance frequency characteristics including a plurality of resonance frequencies.

Figure 4:
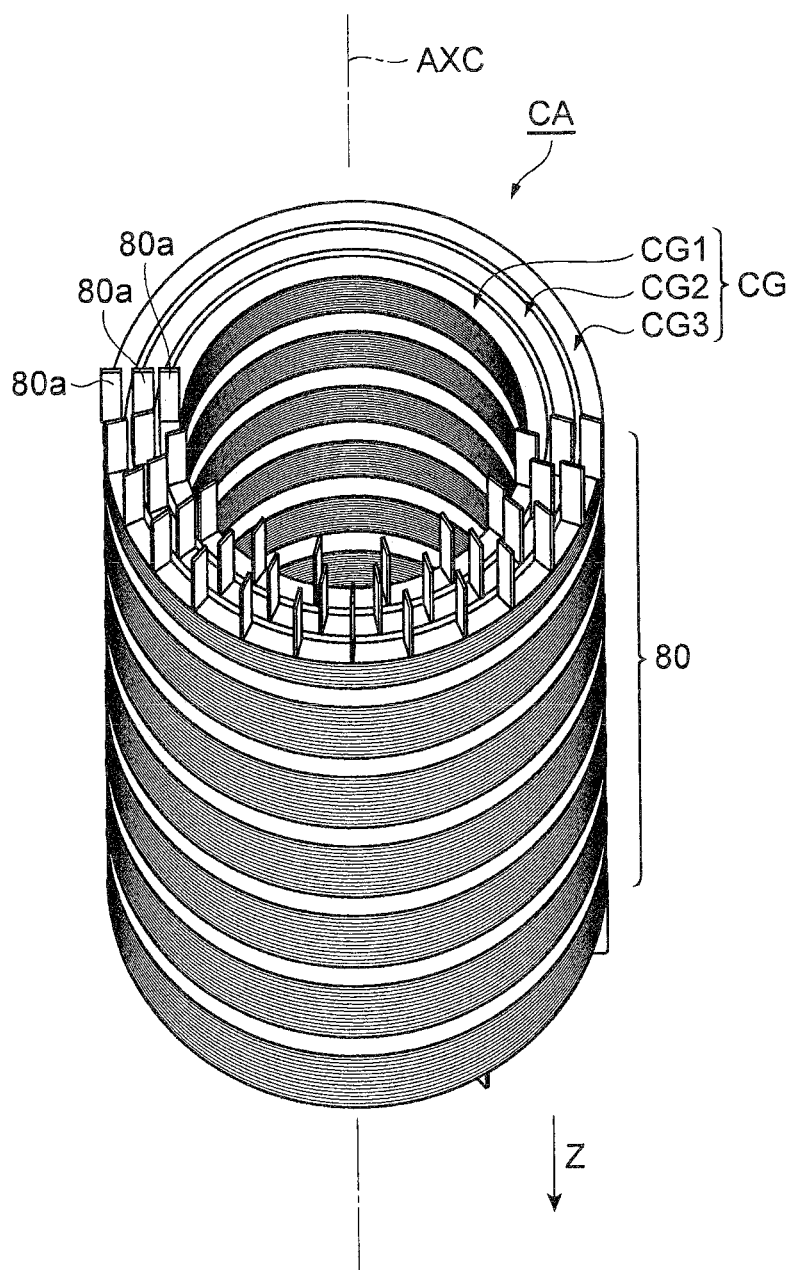
FIG. 4 is a perspective view of a plurality of coils of a filter device according to an embodiment.
Figure 5:
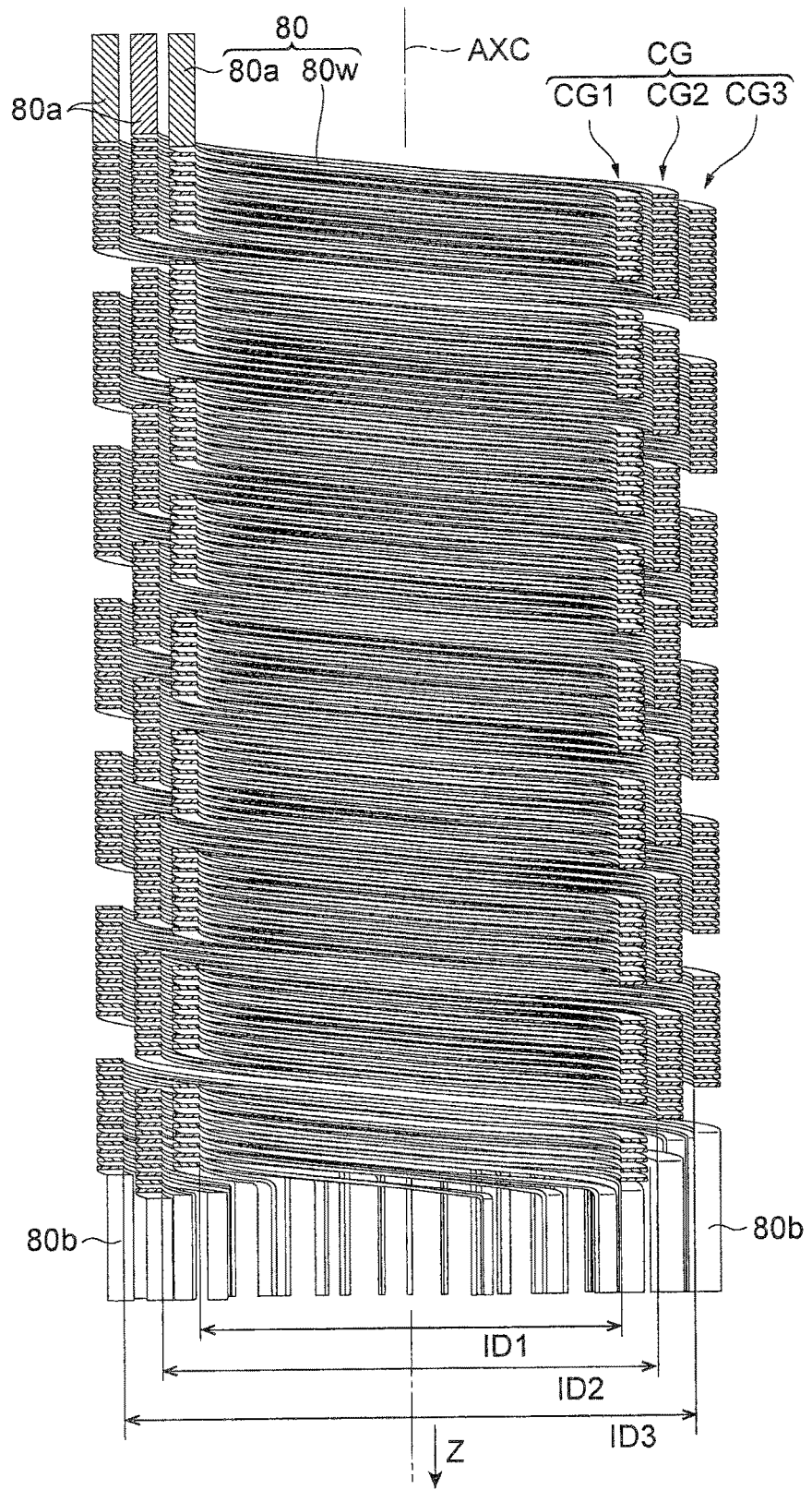
FIG. 5 is a cross sectional view of the plurality of coils shown in FIG. 4.
Figure 6:
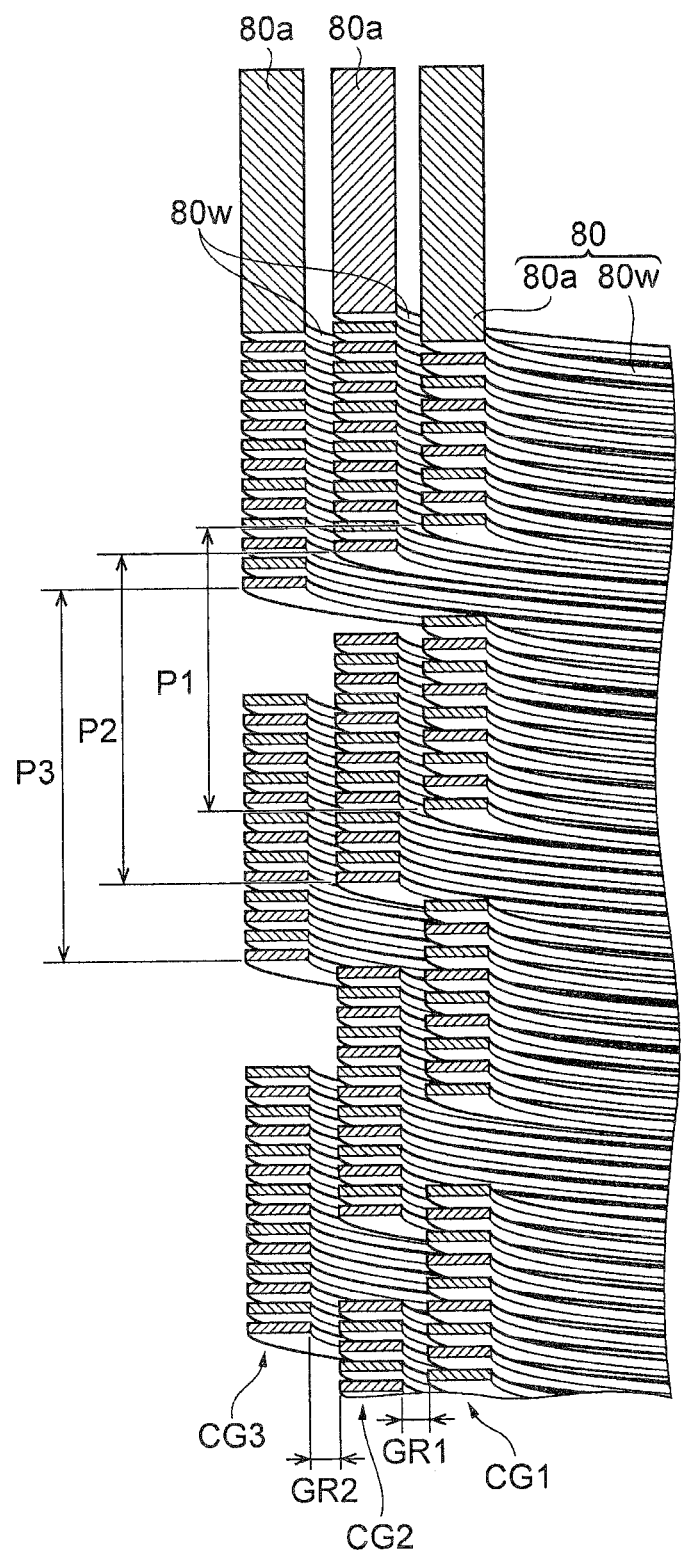
FIG. 6 is an enlarged cross sectional view showing a part of the plurality of coils shown in FIG. 4.

Hereinafter, the plurality of coils 80 will be described in detail. FIG. 4 is a perspective view of the plurality of coils of the filter device according to an embodiment. FIG. 5 is a cross sectional view of the plurality of coils shown in FIG. 4. FIG. 6 is an enlarged cross sectional view showing a part of the plurality of coils shown in FIG. 4. Each of the coils 80 may be an air-core coil. Each of the coils 80 has a conductor and a coating film covering the conductor. The coating film is made of an insulating material. The coating film may be made of a resin such as PEEK (polyetheretherketone) or polyimide. In one embodiment, the coating film of each coil 80 may have a thickness of 0.1 mm or less.

Each of the coils 80 has leader lines 80a and 80b, and a winding portion 80w. The winding portion 80w extends in a spiral shape around a central axis AXC and provides a plurality of turns. The leader lines 80a and 80b extend along an axial direction Z in which the central axis AXC extends. The leader line 80a is connected to one end of the winding portion 80w, and the leader line 80b is connected to the other end of the winding portion 80w. The other end of the winding portion 80w is the end which faces the corresponding capacitor 82.

An assembly of the plurality of coils 80 constitutes a coil assembly CA. The coil assembly CA includes a plurality of coil groups CG. In other words, the plurality of coils 80 constitutes a plurality of coil groups CG. The number of the coil groups CG may be two or more. In the examples shown in FIGS. 4 to 6, the plurality of coil groups CG includes coil groups CG1 to CG3. Each of the coil groups CG includes two or more coils 80. The number of the coils 80 included in each of the coil groups CG may be two or more. In the examples shown in FIGS. 4 to 6, the coil group CG1 includes nine coils 80; the coil group CG2 includes 13 coils 80; and the coil group CG3 includes 14 coils 80.

In the two or more coils 80 of each of the coil groups CG, the respective winding portions 80w extend in a spiral shape around the central axis AXC and are arranged sequentially and repeatedly in the axial direction Z. In other words, the winding portions 80w of the coils 80 of each coil group CG are arranged in multiple layers along the axial direction Z and provided in a spiral shape around the central axis AXC. In one embodiment, in each of the coil groups CG, a distance in the axial direction Z of the gap between adjacent turns in the axial direction Z may be 0.2 mm or less.

The winding portions 80w of the two or more coils 80 of each coil group CG share the central axis AXC and have the same inner diameter. In the examples shown in FIGS. 4 to 6, the coils 80 included in the coil group CG1 have the same inner diameter ID1; the coils 80 included in the coil group CG2 have the same inner diameter ID2; the coils 80 included in the coil group CG3 have the same inner diameter ID3. The winding portions 80w of two or more coils 80 of each coil group CG may have the same cross sectional shape and the same cross sectional dimension. The coils 80 have, e.g., an angular cross section.

The plurality of coil groups CG is coaxially provided to share the central axis AXC. In the examples shown in FIGS. 4 to 6, the coil groups CG1 to CG3 are provided coaxially. In the examples shown in FIGS. 4 to 6, the coil group CG1 is provided at the inner side of the coil group CG2, and the coil group CG2 is provided at the inner side of the coil group CG3. In other words, the inner diameter ID3 of the winding portions 80w of the coils 80 of the coil group CG3 is greater than the outer diameter of the winding portions 80w of the coils 80 of the coil group CG2, and the inner diameter ID2 of the winding portions 80w of the coils 80 is greater than the outer diameter of the winding portions 80w of the coils 80 of the coil group CG1.

The pitch between turns of the coils 80 of any one of the coil groups CG is greater than the pitch between turns of the coils 80 of the coil group provided at the inner side of the corresponding coil group among the plurality of coil groups CG. In the examples shown in FIGS. 4 to 6, the pitch P3 between turns of the coils 80 of the coil group CG3 is greater than the pitch P2 between turns of the coils 80 of the coil group CG2, and the pitch P2 is greater than the pitch P1 between turns of the coils 80 of the coil group CG1. In one embodiment, the pitch between turns of the plurality of coils 80 is set such that inductances of the plurality of coils 80 become substantially the same.

As described above, in the filter device FD, a plurality of coil groups CG, each including two or more coils 80, is provided coaxially to share the central axis AXC. Therefore, the space occupied by the plurality of coils 80 of the plurality of coil groups CG, i.e., the coil assembly CA, is small. Accordingly, the coils 80 of the plurality of filters FT, i.e., the coil assembly CA, can be provided in a small space. When a plurality of coils is simply arranged in parallel, the impedance of the plurality of filters is decreased. However, in the filter device FD, the decrease in the impedance is suppressed by the coupling between the coils 80. In addition, the inductance difference of the coils 80 is decreased because the pitch between the turns of the coils of the outer coil group is greater than the pitch between the turns of the coils of the inner coil group. Therefore, the difference in the frequency characteristics of the impedance of the filters FT is reduced.

In one embodiment, the coils 80 have substantially the same coil length. The coil length is the length in the axial direction Z between one end and the other end of each winding portion 80w of the coils 80. In one embodiment, the difference between the maximum coil length and the minimum coil length of the coils 80 is 3% or less. In accordance with these embodiments, the difference in the frequency characteristics of the impedance of the filters FT is further reduced.

In one embodiment, one ends (opposite the ends facing the capacitor 82) of the winding portions 80w of the plurality of coils 80 are provided along a plane orthogonal to the central axis AXC. In one embodiment, the leader lines 80a of the coils 80 of each of the plurality of coil groups CG are provided at equal intervals in the circumferential direction about the central axis AXC. In one embodiment, the leader lines 80a of the coils 80 are provided within an angular range from 90° to 270° about the central axis AXC. In accordance with these embodiments, the difference in the frequency characteristics of the impedance of the plurality of filters FT is further reduced. The leader lines 80b of the coils 80 of each of the plurality of coil groups CG may be provided at equal intervals in the circumferential direction about the central axis AXC.

In one embodiment, the distance in the radial direction of the plurality of coil groups CG, i.e., the distance in the radial direction of a gap between any two coil groups adjacent to each other in the radial direction about the central axis AXC, is 1.5 mm or less. In the examples shown in FIGS. 4 to 6, the distance GR1 in the radial direction between the coil group CG1 and the coil group CG2, i.e., half of the difference between the outer diameter of the winding portions 80w of the coils 80 of the coil group CG1 and the inner diameter of the winding portions 80w of the coils 80 of the coil group CG2, is 1.5 mm or less. The distance GR2 in the radial direction between the coil group CG2 and the coil group CG3, i.e., half of the difference between the outer diameter of the winding portions 80w of the coils 80 of the coil group CG2 and the inner diameter of the winding portions 80w of the coils 80 of the coil group CG3, is 1.5 mm or less. In the present embodiment, the difference in the frequency characteristic of the impedance of the plurality of filters FT is further reduced.

In one embodiment, the inner diameter of the coils 80 of the outermost coil group among the plurality of coil groups CG is 1.83 times or less than the inner diameter of the coils of the innermost coil group among the plurality of coil groups CG. In the examples shown in FIGS. 4 to 6, the inner diameter ID3 of each of the coils 80 of the coil group CG3 is 1.83 times or less than the inner diameter ID1 of each of the coils 80 of the coil group CG1. In accordance with the present embodiment, the difference in the frequency characteristic of the impedance of the plurality of filters FT is further reduced.

Figure 7:
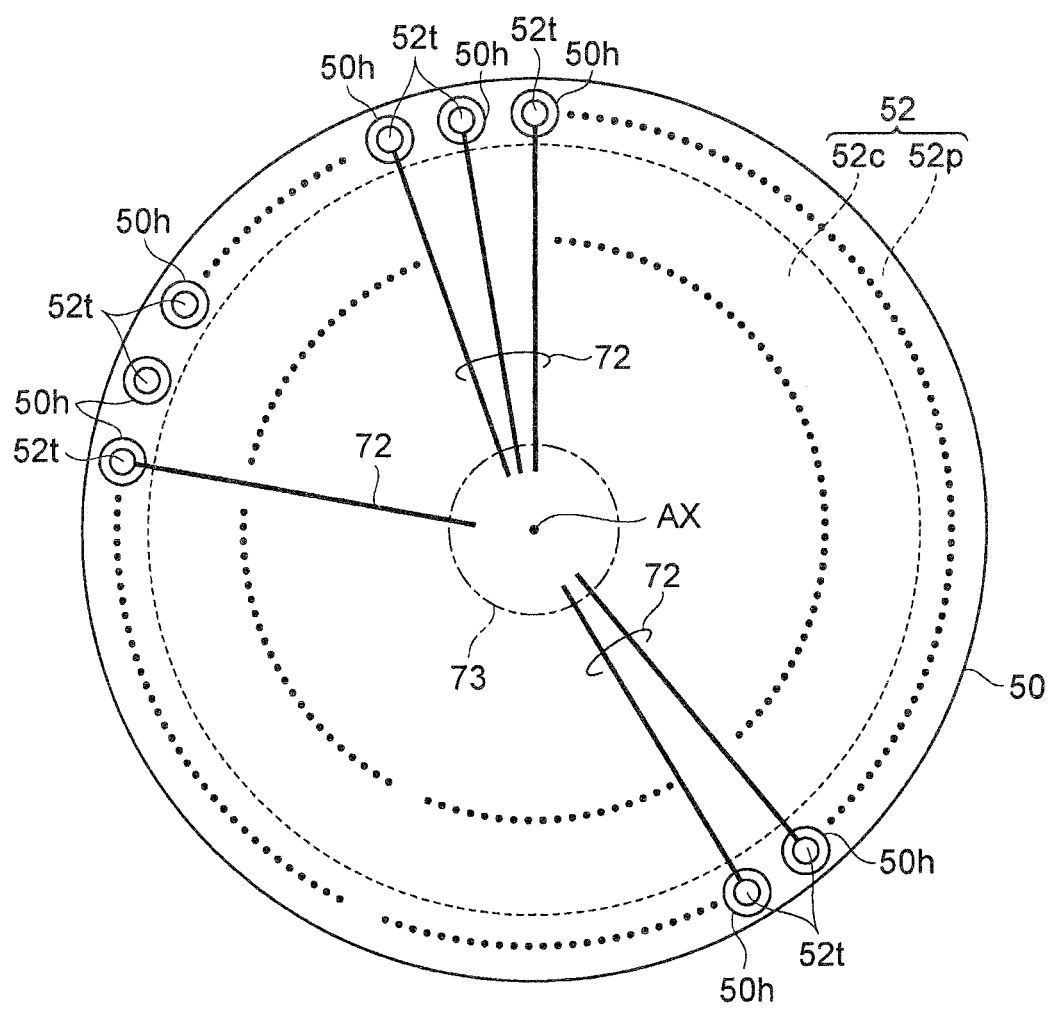
FIG. 7 is a top view showing a plurality of terminals of an electrostatic chuck according to an embodiment.

A plurality of filters FT having a plurality of coils is provided outside the chamber body 12. Therefore, a plurality of power supply lines 70 includes a plurality of wirings 72 in order to connect a plurality of terminals 52t of an electrostatic chuck 52 to the plurality of filters FT (the plurality of coils 80), respectively. Hereinafter, the plurality of wirings 72 respectively connecting the heaters HT and the filters FT will be described in detail with reference to FIGS. 1, 2 and 7. FIG. 7 is a top view showing the plurality of terminals of the electrostatic chuck according to one embodiment. In FIG. 7, the lower surface of the lower electrode 50 and the plurality of terminals 52t are illustrated.

As shown in FIGS. 1, 2 and 7, one ends of the plurality of wirings 72 are connected to the plurality of terminals 52t of the electrostatic chuck 52. As shown in FIG. 7, in one embodiment, the plurality of terminals 52t is provided at the peripheral portion 52p of the electrostatic chuck 52. The plurality of terminals 52t is provided along the lower surface of the peripheral portion 52p and arranged in a circumferential direction with respect to the axis AX. The plurality of terminals 52t may be located at the same distance with respect to the axis AX. A plurality of through-holes 50h is formed in the lower electrode 50 in order to provide paths through which the wirings 72 connected to the respective terminals 52t may pass. The through-holes 50h penetrate the lower electrode 50 directly below the respective terminals 52t. The number of through-holes 50h may be equal to the number of terminals 52t. Alternatively, the number of through-holes 50h may be smaller than the number of terminals 52t. In other words, each of the through-holes 50h may be formed such that two or more terminals 52t are exposed. As shown in FIG. 2, in one embodiment, a wall surface of an insulating member 50i defines a plurality of through-holes 50h. Electrical insulation of the plurality of wirings 72 from the lower electrode 50 is secured by the insulating member 50i.

The plurality of wirings 72 extends to the outside of the chamber body 12 through an inner bore of the conductor pipe 68. The plurality of wirings 72 is connected to one ends (leader lines 80a) of the coils 80 of the plurality of filters FT at the outside of the chamber body 12. In one embodiment, the plurality of wirings 72 extends to an area above the inner bore of the conductor pipe 68 through the region RS. Under the lower electrode 50, the plurality of wirings 72 extends within the region RS surrounded by the lower electrode 50 and the conductive member 54. In one embodiment, each of the wirings 72 extends downward from one end connected to the corresponding terminal among the plurality of terminals 52t through the corresponding through-hole, and extends toward the axis AX within the region RS and to the outside of the chamber body 12 through the inner bore of the conductor pipe 68.

In one embodiment, the plasma processing apparatus 10 includes connectors 73 to 76. Each of the connectors 73 to 76 has a main body and a plurality of terminals. The main body of each of the connectors 73 to 76 is made of an insulator (e.g., PEEK). A plurality of through-holes is formed in the main body of each of the connectors 73 to 76. The through-holes of each of the connectors 73 to 76 are respectively provided with a plurality of terminals. The connector 73 is provided in the central opening of the conductive member 54 and the inner bore of the second pipe 68b. The connector 74 is provided in the inner bore of the upper end portion of the first pipe 68a. The terminals of the connector 73 are connected to a plurality of terminals of the connector 74, respectively. The connectors 75 and 76 are provided in the inner bore of the lower end portion of the first pipe 68a. The connector 76 is provided directly below the connector 75 and extends from the lower end of the first pipe 68a while penetrating through the tubular member 69. A plurality of terminals of the connector 75 is connected to a plurality of terminals of the connector 76, respectively. The plurality of terminals of each of the connectors 73 to 76 partially forms the plurality of wirings 72.

During the above-described operation of the plasma processing apparatus 10, the high frequency powers from the first high frequency power supply 61 and the second high frequency power supply 62 are supplied to the lower electrode 50 through the conductor pipe 68. Therefore, during the operation of the plasma processing apparatus 10, the inner bore of the conductor pipe 68 is shielded from the ground potential. In the plasma processing apparatus 10, the plurality of wirings 72, which electrically connects the heaters HT to the respective filters FT, extends to the outside of the chamber body 12 through the inner bore of the conductor pipe 68. Accordingly, a spatial distance from each of the plurality of wirings 72 to the ground potential is ensured in the inner bore of the conductor pipe 68 and the stray capacitance of each of the wirings 72 is decreased. As a result, the reduction in the impedance of the filters on the power supply lines 70 is suppressed, and the high frequency loss is suppressed.

In one embodiment, as described above, the plurality of wirings 72 extends to the outside of the chamber body 12 through the region RS and the conductor pipe 68. In the present embodiment, during the operation of the plasma processing apparatus 10, the high frequency powers from the first high frequency power supply 61 and the second high frequency power supply 62 are supplied to the lower electrode 50 through the conductor pipe 68 and the conductive member 54. Therefore, during the operation of the plasma processing apparatus 10 of the present embodiment, the region RS is shielded from the ground potential. A spatial distance from each of the wirings 72 to the ground potential is ensured in the region RS and in the inner bore of the conductor pipe 68, and, therefore, the stray capacitance of each of the wirings 72 is further decreased. As a result, the reduction in the impedance of the filters on the power supply lines 70 is further suppressed, and the high frequency loss is further suppressed.

In one embodiment, as described above, the conductor pipe 68 shares a common central axis, i.e., the axis AX, with the electrostatic chuck 52, the lower electrode 50, and the conductive member 54. The plurality of terminals 52t of the electrostatic chuck 52 is provided on the peripheral portion 52p of the electrostatic chuck 52 and located at the same distance with respect to the axis AX. Each of the wirings 72 extends downward from one end connected to the corresponding terminal among the plurality of terminals 52t through the corresponding through-hole 50, and extends toward the axis AX within the region RS and to the outside of the chamber body 12 through the inner bore of the conductor pipe 68. In the present embodiment, the difference in the lengths of the plurality of wirings 72 is reduced, and, therefore, the difference in the impedances of the filters on the power supply lines 70 with respect to the high frequency is reduced. As a result, the in-plane uniformity of the plasma processing is improved.

In one embodiment, as described above, the matching unit 64 is provided at a lateral side of the conductor pipe 68. In the present embodiment, a space for arranging the plurality of filters FT, i.e., the filter device FD, is secured below the conductor pipe 68. Therefore, the length of the plurality of wirings 72 becomes shorter. As a result, the reduction in the impedance of the filters on the power supply lines 70 is further suppressed, and the high frequency loss is further suppressed.

While various embodiments have been described above, various modifications can be made without being limited to the above-described embodiment. For example, the plasma processing apparatus according to a modification may be a plasma processing apparatus having any plasma source, such as an inductively coupled plasma processing apparatus, a plasma processing apparatus for generating plasma by using surface waves such as microwaves, or the like.

Further, the plurality of coils 80 may not share the central axis AXC. In other words, the plurality of coils may be arranged to have individual central axes parallel to each other.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
a chamber body that provides a chamber;
a stage configured to support a target object in the chamber, the stage including a lower electrode, an electrostatic chuck provided on the lower electrode, a plurality of heaters, and a plurality of terminals electrically connected to the plurality of heaters;
a high frequency power supply provided outside the chamber body and configured to generate a high frequency power to be supplied to the lower electrode;
a conductor pipe configured to electrically connect the high frequency power supply and the lower electrode, and wherein the conductor pipe is electrically connected to the high frequency power supply;
a plurality of power supply lines configured to supply power from a heater controller to the plurality of heaters; and
a plurality of filters, which partially forms the plurality of power supply lines, provided outside the chamber body and configured to prevent the inflow of high frequency power from the plurality of heaters to the heater controller,
wherein the plurality of power supply lines includes a plurality of wirings respectively connecting the plurality of terminals and the plurality of filters,
wherein the plurality of wirings extends to the outside of the chamber body through an inner bore of the conductor pipe,
wherein the stage further includes a conductive member provided below the lower electrode,
the conductive member is electrically connected to the lower electrode, and the conductive member is provided below the lower electrode, and a region is defined between the conductive member and the lower electrode at a location below the lower electrode,
one end of the conductor pipe is connected to the conductive member,
the plurality of wirings extends to the outside of the chamber body through the region and the inner bore of the conductor pipe,
the conductor pipe shares a common central axis with the electrostatic chuck, the lower electrode, and the conductive member,
the plurality of terminals is provided at a peripheral portion of the electrostatic chuck and located at the same distance with respect to the central axis, and
each of the plurality of wirings extends downward from one end connected to a corresponding terminal among the plurality of terminals through a hole formed in the lower electrode, and laterally extends toward the central axis through the region, and then extends to the outside of the chamber body through the inner bore of the conductor pipe.

2. The plasma processing apparatus of claim 1, further comprising a matching unit for impedance matching, provided between the conductor pipe and the high frequency power supply.

3. The plasma processing apparatus of claim 1, further comprising a matching unit for impedance matching, provided between the conductor pipe and the high frequency power supply,
wherein the matching unit is provided at a lateral side of the conductor pipe.

4. The plasma processing apparatus of claim 1, wherein the plurality of filters constitute a filter device, and wherein in the filter device, a plurality of coil groups, each including a plurality of coils, is provided coaxially to share a central axis.

5. The plasma processing apparatus of claim 2, wherein the conductor pipe has a first pipe, a second pipe, and a third pipe made of a conductor, and wherein the second pipe is connected to the conductive member, and wherein the third pipe is electrically connected to the high frequency power supply via the matching unit, and wherein a lower end portion of the first pipe is fitted into an inner bore of the third pipe, and wherein an upper end portion of the first pipe is fitted into an inner bore of the second pipe.

6. The plasma processing apparatus of claim 1, wherein a tubular member is provided to surround the conductor pipe, wherein the tubular member is electrically grounded and is connected to the chamber body.

7. The plasma processing apparatus of claim 1, wherein the electrostatic chuck includes a central portion and a peripheral portion which extends in a circumferential direction at an outer side of the central portion, and wherein an upper surface of the peripheral portion extends at a position lower than an upper surface of the central portion.

8. The plasma processing apparatus of claim 7, wherein the target object is mounted on the central portion and a focus ring is mounted on the peripheral portion.

9. The plasma processing apparatus of claim 7, wherein the peripheral portion is provided with the plurality of terminals.

10. The plasma processing apparatus of claim 1, wherein the plurality of filters includes a plurality of coils and a plurality of capacitors, wherein the plurality of coils are accommodated in a frame which is made of a conductive material and electrically grounded, and wherein the plurality of capacitors are accommodated in a capacitor box which is electrically connected to the frame.

11. The plasma processing apparatus of claim 10, wherein the capacitor box and the frame are formed as one unit.

12. The plasma processing apparatus of claim 4, wherein each of the plurality of coils has a conductor and a resin covering the conductor.

13. The plasma processing apparatus of claim 4, wherein the plurality of coil groups includes a first coil group and a second coil group, and wherein the first coil group is provided at the inner side of the second coil group.

14. The plasma processing apparatus of claim 13, wherein the inner diameter of the second coil group is greater than the outer diameter of the first coil group.

15. The plasma processing apparatus of claim 13, wherein the number of coils included in the first coil group is different from the number of coils included in the second coil group.

16. The plasma processing apparatus of claim 13, wherein a pitch between turns of coils of the second coil group is greater than a pitch between turns of coils of the first coil group.

17. The plasma processing apparatus of claim 4, wherein the plurality of coils have leader lines which are connected to the plurality of wirings, and wherein the leader lines are provided at equal intervals in the circumferential direction about the central axis.

18. The plasma processing apparatus of claim 1, wherein at least one connector is provided at a lower end opening of the conductor pipe, the at least one connector including an insulator, and the plurality of wirings exit the conductor pipe through the at least one connector.

19. The plasma processing apparatus of claim 6, wherein at least one connector is provided at a lower end opening of the conductor pipe, the at least one connector including an insulator, and the plurality of wirings exit the conductor pipe through the at least one connector, and wherein the at least one connector penetrates through the tubular member, and with respect to a direction extending from the plurality of heaters to the heater controller, the plurality of wirings first exit the conductor pipe and then pass through the tubular member at a location at which the at least one connector penetrates through the tubular member.

20. The plasma processing apparatus of claim 19, wherein the at least one connector includes one connector at the lower end opening of the conductor pipe and another connector which penetrates through the tubular member, wherein the another connector is below the one connector, and each of the one connector and the another connector includes an insulator.

* * * * *